United States Patent
O'Gorman (10) Patent No.: US 7,083,994 B2
(45) Date of Patent: Aug. 1, 2006

(54) METHOD OF MANUFACTURING A SEMICONDUCTOR DEVICE WITH OUTLINE OF CLEAVE MARKING REGIONS AND ALIGNMENT OR REGISTRATION FEATURES

(75) Inventor: James O'Gorman, Dublin (IE)

(73) Assignee: Eblana Photonics Limited, Dublin (IE)

( * ) Notice: Subject to any disclaimer, the term of this patent is extended or adjusted under 35 U.S.C. 154(b) by 0 days.

(21) Appl. No.: 10/492,061

(22) PCT Filed: Oct. 7, 2002

(86) PCT No.: PCT/IE02/00141

§ 371 (c)(1),
(2), (4) Date: Sep. 23, 2004

(87) PCT Pub. No.: WO03/044871

PCT Pub. Date: May 30, 2003

(65) Prior Publication Data

US 2005/0032264 A1   Feb. 10, 2005

(30) Foreign Application Priority Data

Oct. 11, 2001   (GB) .................... 0124427.6

(51) Int. Cl.
*H01L 21/00*   (2006.01)
(52) U.S. Cl. ............... 438/29; 438/31; 438/33; 438/39; 438/42; 438/113; 438/401; 438/458; 438/462; 438/700; 438/942; 438/945; 438/946; 438/948; 438/975

(58) Field of Classification Search .......... 438/22, 438/29, 31, 33, 39, 42, 68, 113, 164, 401, 438/458, 462, 669, 671, 674, 700, 942, 945–946, 438/948, 975
See application file for complete search history.

(56) References Cited

U.S. PATENT DOCUMENTS

| | | | | |
|---|---|---|---|---|
| 5,259,925 A | * | 11/1993 | Herrick et al. | 438/460 |
| 5,284,792 A | * | 2/1994 | Forster et al. | 438/29 |
| 5,790,737 A | | 8/1998 | Aoyagi et al. | 385/131 |
| 6,278,173 B1 | | 8/2001 | Kobayashi et al. | 257/627 |
| 6,289,030 B1 | * | 9/2001 | Charles | 372/49 |

FOREIGN PATENT DOCUMENTS

| | | |
|---|---|---|
| EP | 1028340 | 8/2000 |
| JP | 02039481 | 2/1990 |
| JP | 08064906 | 3/1996 |
| WO | WO 02/31863 | 4/2002 |

* cited by examiner

Primary Examiner—Lynne A. Gurley
(74) Attorney, Agent, or Firm—Kusner & Jaffe (57) ABSTRACT

This invention generally relates to semiconductor devices, for example lasers and more particularly to single frequency lasers and is directed at overcoming problems associated with the manufacture of these devices. In particular, a laser device is provided formed on a substrate having a plurality of layers (1,2,3,4,5), the laser device comprising at least one waveguide (for example a ridge) established by the selective removal of sections of at least one of the layers. Wherein alignment features are provided on the device to facilitate subsequent placement.

31 Claims, 6 Drawing Sheets

METHOD OF MANUFACTURING A SEMICONDUCTOR DEVICE WITH OUTLINE OF CLEAVE MARKING REGIONS AND ALIGNMENT OR REGISTRATION FEATURES

FIELD OF THE INVENTION

The invention relates generally to semiconductor devices, in particular opto-electronic devices, for example waveguides and more particularly to a high accuracy method of fabricating alignment or registration features on these devices to assist in subsequent alignment or registration of the device with another surface or device.

BACKGROUND TO THE INVENTION

Electronic devices are well known in the art, of which one variety are opto-electronic devices including waveguides. Waveguides, including for example filters, lasers or laser diodes have many applications in the fields of data communications, telecommunications, metrology and sensing.

Figure 1:
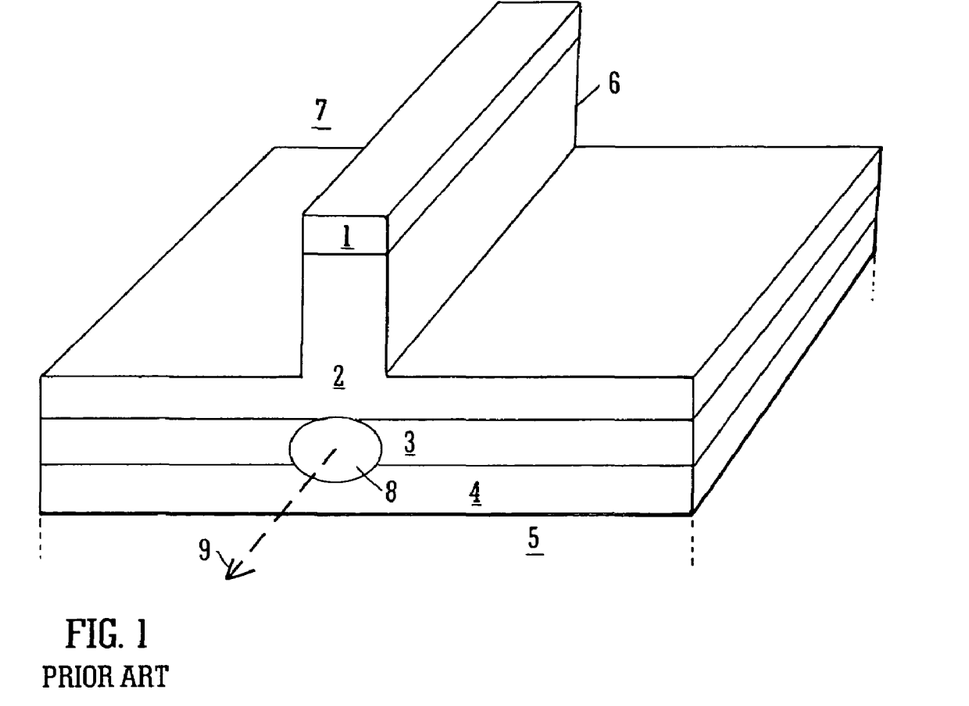
FIG. 1 is a schematic of a conventional prior art ridge laser structure.
Figure 2:
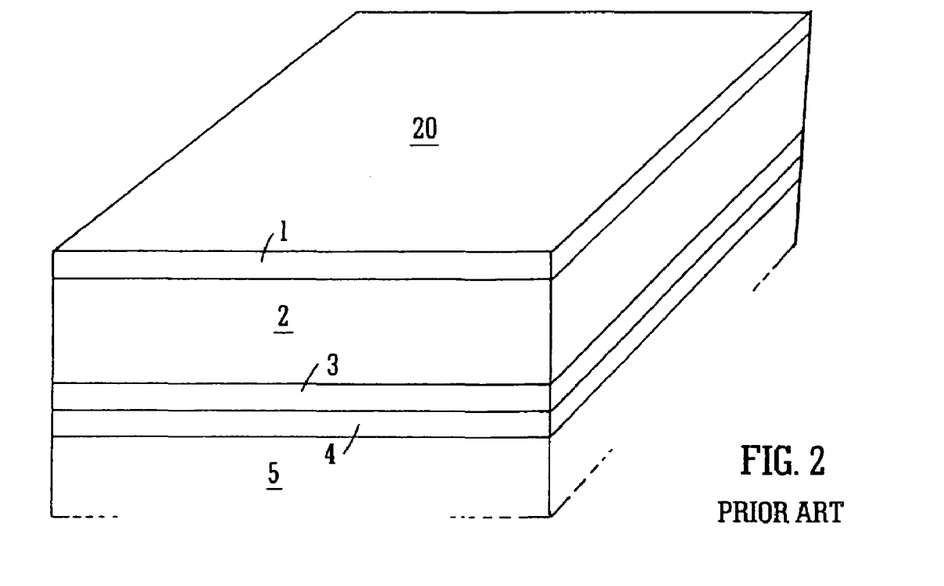
FIG. 2 is a schematic showing a section of semiconductor body from which, an optoelectronic device, for example a ridge laser may be constructed.

One example of a known optoelectronic device is the ridge waveguide laser. FIG. 1 illustrates a typical example of a "ridge" laser or lasing device 7. The representation of a finished ridge laser device is a simplified version for the purposes of explanation. In operation, light 9 is primarily emitted from shaded region 8. The formation of a "ridge" 6 is effected by etching into a layered material, as shown in FIG. 2, comprising a series of at least four epitaxial layers 1, 2, 3, 4 formed on a semiconductor substrate 5. For a n-type substrate 5, the top layer 1 which is the contact layer comprises p-type material, the second layer 2 is a cladding layer and also comprises p-type material. The third layer 3 typically comprises a number of undoped active layers which are used for light guiding and gain purposes and may be composed of bulk, quantum well or quantum dots. The fourth layer 4 is an n-type cladding layer. It will also be understood that suitable etch stopping layers may also be incorporated into the structure 20. As with other semiconductor devices, typically a large number of ridge lasers are formed on a single semiconductor wafer and subsequently divided. Accordingly, the structures illustrated should be taken as only a part of a larger semiconductor body.

For the case of a InP laser emitting in the 1.2–2.0 µm wavelength range, the epitaxial top layer 1 is typically InGaAs, with the second and fourth layers and the substrate typically InP, with layer 3 typically containing InGaAsP and/or InGaAlAs. Other material combinations are also possible. It will also be appreciated that alternative semiconductor materials, e.g. those based on GaAs, GaSb, or GaN would incorporate different epitaxial layers and could require alternative etchants.

Figure 3:
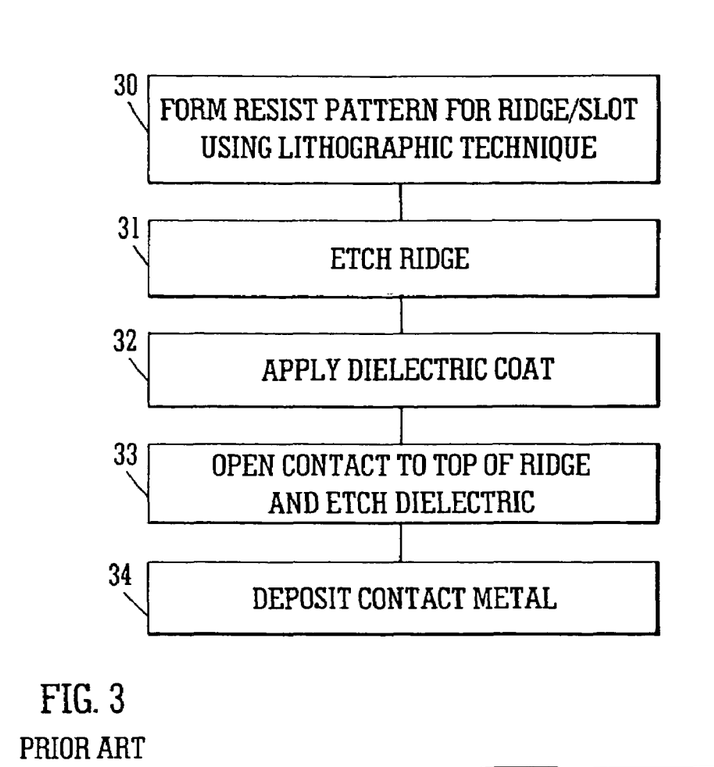
FIG. 3 is a flowchart illustrating the steps in the process of manufacturing a conventional ridge laser of the type shown in FIG. 1 from the semiconductor body of FIG. 2.
Figure 4:
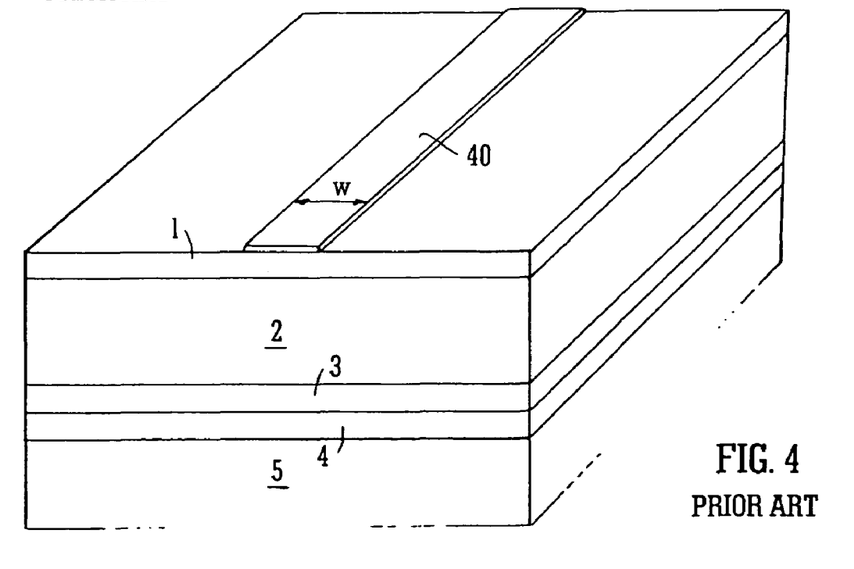
FIG. 4 is a schematic showing the semiconductor body of FIG. 2 having an applied layer of resist pattern.

The process of manufacturing a "ridge" laser, as illustrated in simplified form in FIG. 3, commences with the formation (30) of the outline of the ridge in a layer of resist material 40, as shown in FIG. 4, on the top layer 1, using a suitable lithographic technique. The shape of the resist material is determined by the mask used in the lithographic process. The subsequent outline of the ridge formed will be determined by the outline of the mask.

Figure 5:
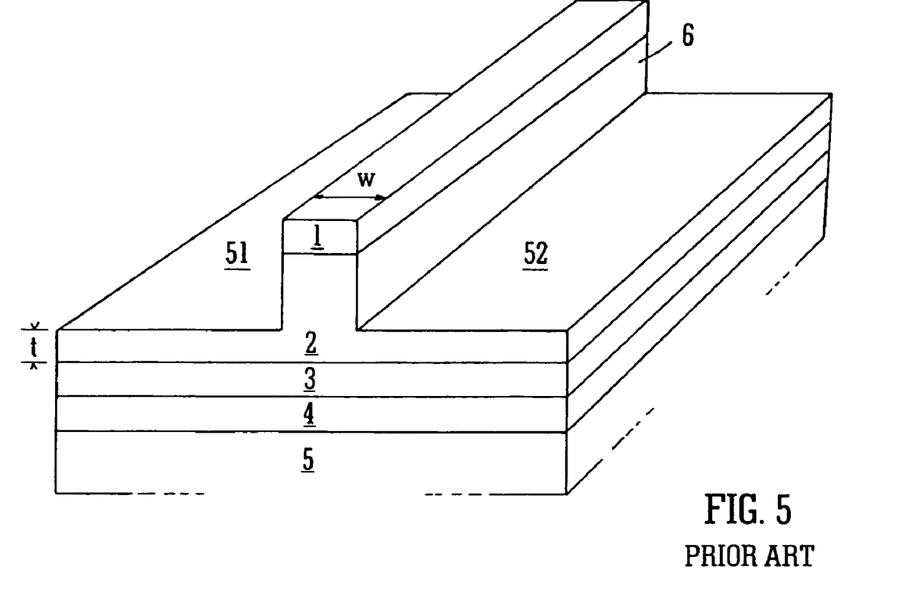
FIG. 5 is a schematic showing the structure of FIG. 4 after an etching process has been performed, FIG. 6 (a–c) represents profile views of the structure of FIG. 4 and demonstrate the final steps in the manufacturing process for a ridge laser.

The next step in the process is to etch 31 the structure to remove the top layer and part of the second layer in regions not covered by the resist material. The thickness (t) of the remaining portion of layer 2 in the region which has been etched 51, 52 contributes to the characteristics of the finished "ridge" laser. In regions covered by the resist material, the top layer and second layer are substantially unaffected by the etching process, thus leaving a raised surface or "ridge" effectively matching the mask outline. The width of the ridge (w) formed matches that of the outline formed by the resist material 40.

Figure 6A:
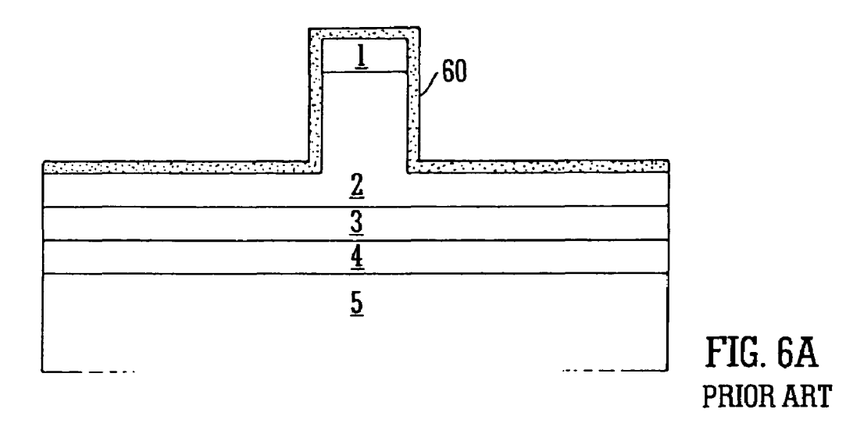
Figure 6B:
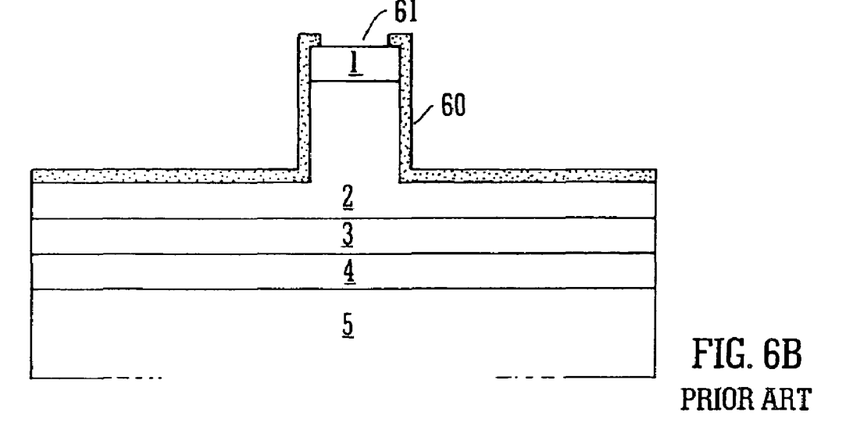
Figure 6C:
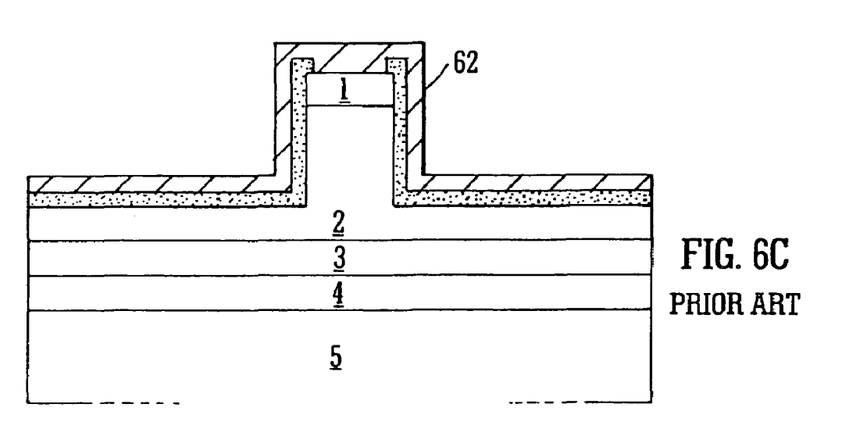

The third step 32 in the process is to apply a dielectric coating 60 over the structure, as shown in FIG. 6a. The next step 33 involves removing a portion 61 of the dielectric material 60 covering the top surface of the ridge, as illustrated in FIG. 6b, using a conventional etching technique. The final step 34 is to apply a metal contact layer 62 on the portion of the ridge 6 not covered by the dielectric material to form a metal contact 62, as shown in FIG. 6c. Other steps not shown include an alloy and thinning of the substrate to approximately 100–120 µm, a further metal coating step to apply a metal contact layer to the substrate with subsequent alloy, a cleaving step in which the ridge laser is cleaved at a particular point to define its end, and the breaking up of the wafer into individual ridge laser devices.

It is advantageous to include a defect in the ridge to improve waveguide performance.

Figure 7:
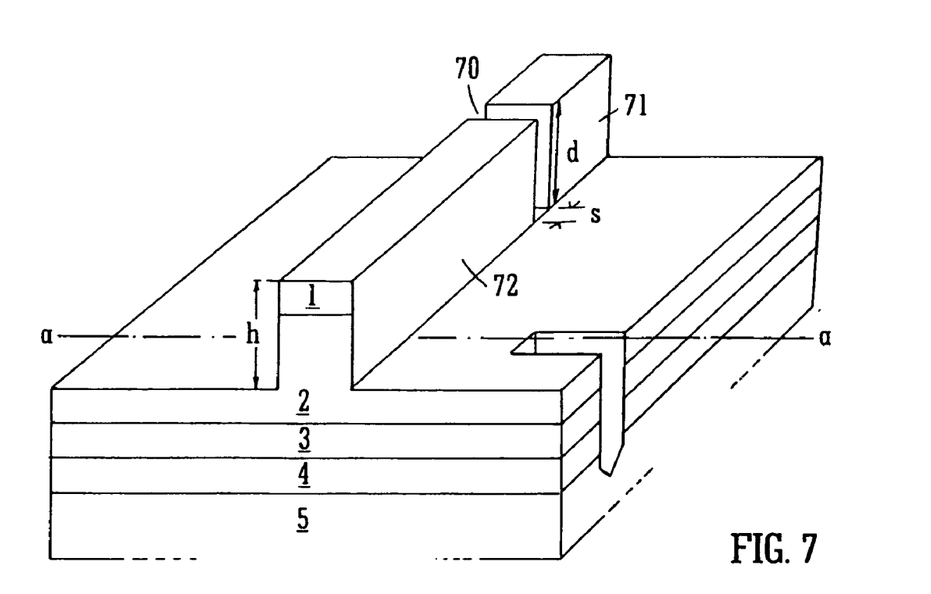
FIG. 7 shows a pictorial view of a further example of a prior art ridge laser device.

Conventionally, the length of the ridge and accordingly the length of the laser are defined by marking the edge of the processed material with a diamond scribe perpendicular to the ridge. Increasing sophistication of tools now permits an absolute marking accuracy of a few microns with relative marking accuracy less than 1 µm. However, in order to have accurate absolute markings with respect to the defect (for example slot) location, a special cleave feature is defined lithographically. This is achieved using a non-selective dry etch through the active layers and a special crystallographic wet etch that ends in a sharp line; this being the intersection between two crystal planes, as shown in FIG. 7. The edge then serves as the location of the cleave plane and hence the end of the laser (referred to as the facet). For example, in FIG. 7 the ridge laser device would have its end defined by the line a—a after the cleaving process. The appropriate wet etchant for InP substrate is HCl. Again, it will be appreciated that the etchants described hereinbefore are specific to an InP substrate and that alternative substrates such as GaAs may require different etchant materials. The registration of the slot with respect to the cavity length is obtained by the high resolution of the direct write electron beam lithography system. The cleave feature is formed in a separate process to the formation of the ridge and slots.

As detailed above, this existing technique is implemented using direct write electron beam lithography, which is highly accurate in its definition of features and in referencing between lithographic levels. However, use of this technique is slow, expensive and does not deliver sufficient cost benefit to be favoured over alternative techniques. Due to the large costs associated with purchasing and running direct electron beam lithographic equipment, it will be appreciated that it is not commercially feasible to use such equipment for production purposes. To be commercially viable the process needs to be implemented with more cost efficient techniques such as optical lithography. In the present application, the use of the word optical is intended to include any lithographical process using the projection of a resist modifying flux through suitable masking apertures, and includes but is not limited to the use of visible light, deep UV, or scattering electron beam lithography.

The use of optical lithography has, however, associated shortcomings such as resolution and alignment accuracy. In particular, to the resolution requirement to define, for example, a ridge of width of the order of 3 µm, having a slot with a gap of the order of 0.5 μm, is not obtainable using conventional optical lithographic techniques.

An important alignment is in the referencing between a defect in the ridge and the laser facet. It will be understood by those skilled in the art that in the context of the present application, a defect is an element which effects a change in the reflective index or gain of a structure, feature or waveguide. The laser facet is the break in the laser which is along a crystal axis and which is the mirror providing feedback into the laser. The position of the laser facet is defined by the cleave feature as shown in FIG. 7. The reflectivity of the facet may be changed by the application of coatings. It is advantageous to have this referencing as accurate as possible for best reproducibility in device performance. The cleave feature is a notch formed by etching. FIG. 7 illustrates that the ridge is the only structure extending above the etched surface and that the cleave feature starts at the etched level. It will be appreciated that conventionally, whilst areas adjacent to the ridge may be etched, other regions of the semiconductor structure may be of similar height to the ridge. In these situations the cleave feature will extend from the top layer through to the substrate. In the direct write electron beam process prior art the cleave feature is formed in a different step of the process to the ridge and defect (slot). Alignment of the slot and cleave feature is achieved by the resolution available through electron beam lithography.

A known problem associated with optoelectronic devices, including ridge lasers, after the initial manufacturing processes is the subsequent placement of the devices on optical or electrical circuit board, e.g. a substrate or other suitable structure on which components may be mounted, and their alignment with the circuit and/or other components thereon.

Accordingly, it would be beneficial if a method of manufacturing opto-electronic devices could be provided, which would facilitate the subsequent alignment of the opto-electronic device to other structures and which could be manufactured using conventional optical lithography techniques.

SUMMARY OF THE INVENTION

These needs and others will be met by the present invention, which is set out in detail in the claims which follow.

Further objects, features and advantages of the present invention will become apparent from the following description and drawings.

BRIEF DESCRIPTION OF THE DRAWINGS

The invention will now be described in more detail having regard to the accompanying drawings in which.

DETAILED DESCRIPTION OF THE DRAWINGS

FIGS. 1 to 7 have been discussed with reference to the prior art in the section "Background to the Invention".

It is advantageous to include a topologocial feature on the laser surface to allow accurate fixing of semiconductor devices with high precision in positions relative to each other, an example of which is where one wishes to couple the light from the waveguide of a laser to a external waveguide for example a fibre or semiconductor waveguide.

For high efficiency coupling of light to external waveguides, a special cleave feature is necessary, which is referenced to topological features on the laser surface which are in turn referenced to the waveguide position.

An aspect of the invention provides a process for the production of electronic devices, including opto-electronic devices for example waveguides, from a semiconductor body. The process includes an intermediate step of forming a cleave feature and the fabrication of alignment/registration features, so that when a cleaving process has been completed, the facet (and/or other topographical features) of the device are aligned with respect to the cleaving feature and alignment/registration features. This technique uses the availability of selective etchants for the different layers that comprise the epitaxial material.

The example which follows relates to Indium Phosphide (InP) based lasers where typically an InGaAs(P) active layer system is sandwiched between InP n- and p-doped layers on an n-type InP substrate.

It will be appreciated that the layers and device described herein are illustrative only, and it is not intended to limit the application of the present invention to such specifics. For example, the 'active' region may consist of 10's of individual layers, comprised for example of quantum wells. Semi-insulating substrates could also be used, as could "p type" substrates, but as is known within the art "p type" substrates are not of as high a quality. Similarly, the technique may be used for other opto-electronic devices, including for example detectors, filters, couplers, etc.

Figure 8:
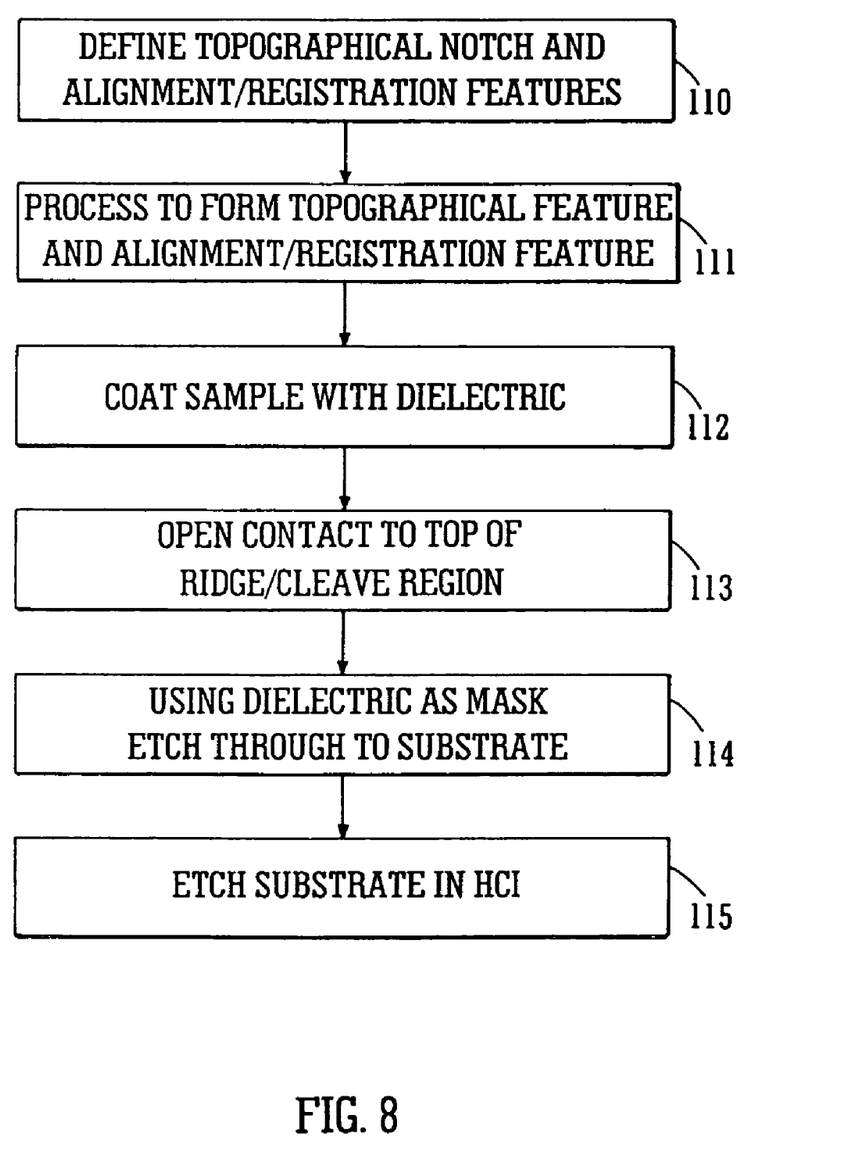
FIG. 8 is a process according to the invention.
Figure 9:
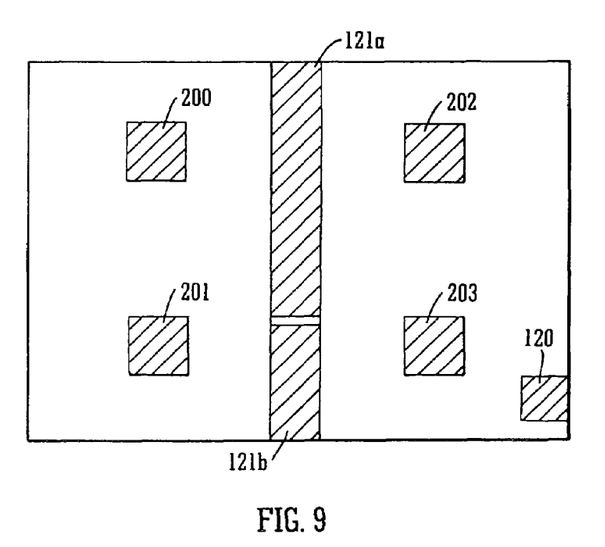
FIG. 9 represents the masking (resist)patterns is an exemplary embodiment of the invention.

The process, shown in FIG. 8, commences with the marking 110 of a cleave marking region 120 in area of masking material, e.g. photo resist material, at the same time as marking the outline of one or more primary topographical features which will ultimately form the essential structure of the device, i.e. the ridge pattern 121a, 121b in the resist material as shown in FIG. 9 (the resist material is the hatched area), which will ultimately form the ridge of a ridge laser.

At the same time, one or more secondary topographical (alignment/registration) patterns 200, 201, 202, 203 are marked in the masking (resist) material. These alignment or registration patterns will ultimately form alignment or registration features. In the present example, the secondary topographical features are distinct from the primary topographical features. In the example shown, the alignment\registration features are only provided for subsequent alignment purposes, i.e. they do not affect the operation of the ridge structure.

The next step 111 is to use a first etching process to form the primary topographical features, i.e. the ridge sections. The ridge sections are separated by a defect defining region, (in the example shown a slot) resulting from a corresponding feature in the masking material. The first etching process also forms a cleave marking notch 120 and one or more secondary topographical features. These secondary topographical features will serve subsequently as alignment or registration features. This first etching process may for example be a non-selective plasma etch to etch into the InP upper cladding layer (layer 2). It will be appreciated that any etch which allows the preservation of the pattern is equally applicable, for example a methane and hydrogen reactive ion etch (RIE) may be used for InP based materials, whereas other plasmas may be more applicable for GaAs materials.

As an alternative to using a single etching process to form the topographical feature (i.e. the ridge and slot) and cleave marking notch, the layer of masking (resist) material forming the cleave marking region and the topographical feature may be used as a guide for subsequent processes. Thus for example it is conceivable that the etching process (111) is replaced by two distinct processes, the first operating on the cleave marking region with a second process operating on the ridge region. The important factor is that the primary topographical features, secondary topographical features and cleave features are outlined in the same process and are thus registered with respect to one and other.

The next stage 112 in the process is the application of a layer of dielectric material. The next step 113 involves opening the top of the ridge and the cleave region 120 using a suitable technique. This step may also open the region adjacent to the notch. Accordingly, a layer of dielectric material is absent at and adjacent to the cleave marking notch.

A subsequent non selective dry etch step is performed to etch 114 through the InGaAs(P) active layers, but because of the dielectric this is confined to regions adjacent to the notch, i.e. the dielectric acts as a resist layer. The effect of the second etching process is to form a tiered notch, the lower tier having been formed by the action of the first and second etching processes with the upper tier formed by the second etching process. The lower tier extends to the substrate, whereas the upper tier remains in the epitaxial layers. The final step 115 in the process is a crystallographic etch for InP, which will define a cleave feature, by finding a crystal axis. In certain circumstances, the use of a crystallographic etch on its own may be sufficient and the second etching process may be omitted. This will depend however on the substrate and epitaxial layer materials and the etches selected.

As the initial cleave marking resist region was formed using the same mask as was used for forming the primary topographical features comprising the ridge and slot, it will be clear that the resulting cleave feature will be self aligned with the slot. It will be further appreciated that the secondary topographical features are also aligned with respect to the cleave feature, and additionally with respect to the primary topographical feature.

Accordingly, as the cleave feature is formed within the cleave marking notch, it is clear that it will be aligned with respect to the primary topographical features, and in the particular example with respect to the slots in the ridges formed on the semiconductor body. Similarly, the secondary topographical features are aligned with respect to the primary topographical features.

Thus the invention provides for accurate facet or length positioning of topographic features such as a slot with respect to the overall length of a semiconductor or laser device, and their alignment with respect to secondary topographical features, which may be used in a subsequent process for subsequent alignment or registration with other devices or surfaces.

It will also be appreciated that the process steps, generally described herein with respect to ridges and slots are equally applicable for any general topographic feature or means of effecting index or gain changes. It will be furthermore appreciated that the process described for ridge waveguides may also be applied with minor modification to other, more general electronic, and in particular, opto-electronic structures.

In addition, it will be appreciated by those skilled in the art, that further process steps may be carried out on the topographical features and alignment features to prepare them for subsequent use.

Further steps in the assembly of an opto-electronic device according to a further aspect of the invention are now described.

These further steps commence with a cleaving process, in which the semiconductor body is cleaved at a particular point to define an end of the primary topographic feature, e.g. the facet of a laser. The cleaving feature is used as a guide for the cleaving process. The feature works by providing a point of weakness is the substrate structure so that when a force is applied to the underside of the substrate, a crack forms and propogates from the point of weakness (i.e. the cleaving feature). Additionally, the semiconductor body (wafer) may be separated into individual devices (singulation).

The next step involves the mounting of the individual devices on a circuit board or other similar structure to facilitate the coupling of individual devices to other devices.

Conventionally, this process is extremly difficult, requiring great care and attention to ensure that the devices when mounted are aligned or registered with respect to other devices. The presence of the hereinbefore described secondary topographic (alignment/registration) features on the device, facilitates an improvement in this process.

This improved process will now be described. The process initially requires at least one first device having a pattern of alignment\registration features formed thereon as described by the above process. At least one second device/surface having a corresponding pattern of alignment\registration features formed thereon, for example formed using the above described process.

In use, the areas of of the first device and second device/surface having the alignment\registration features device/surface will be mutually opposing, since the area of one device having the alignment\registration features will be inverted and mounted on the area of the other device having the alignment\registration features so that the features face each other. Thus the alignment\registration features of the second device/surface will be a mirrored representation of the alignment\registration of the first device.

A layer of joining material is then selectively applied to the alignment\registration features of either the first device or the second device/surface.

The joining material may include for example liquid or liquifiable materials such as adhesive, including epoxy resins or soldering materials, i.e. solder paste.

The layer of joining material and the alignment\registration features may provide electronic or other connections between the device and structure.

After selective application of the layer of joining material, the first device is then inverted and placed on the structure such that the alignment/registration pattern of features of the first device faces the topographical (alignment/registration) features of the second device/surface. It is not necessary that the secondary topographical (alignment/registration) features and the underlying alignment/registration pattern are accurately aligned.

Surface tension and or other forces such as Van Der Waals forces in the joining material provides a force in the joining material which tends to cause the mutual alignment of alignment\registration features of the first device with corresponding alignment/registration features of the second device/surface.

In the case of using a material, such as solder paste, it will be appreciated that a reflow process may be required to cause surface tension to align/register the device to the structure.

As the primary topographical features of the device and the cleave feature are aligned with the secondary topographical feature. These features are automatically aligned with respect to the underlying structure.

Similarly, the first device will be aligned with respect to any other device which has been aligned on the second device/structure. Accordingly, several devices may be placed and aligned in a single process.

In an alternative embodiment, the at least one primary topographic feature acts as an alignment\registration feature. Moreover, in certain circumstances it will be appreciated that there will be no separate alignment\registration features and that alignment may be provided using only primary topographic features. For example, where a plurality of ridge lasers are provided on a single device the primary topographic features of the ridges may be sufficient to function as alignment\registration features. However in general, it is preferred that separate alignment\registration features be provided to the primary (functioning) topograhic features.

The present invention offers many advantages over prior techniques in that it provides a method of using projection (optical) lithography to manufacture devices which may be accurately aligned on a structure without expense. As such the cost of fabrication is reduced with the result that devices of the present invention may be applied to a wide variety of applications. The versatility of the technique allows the manufacture of integrated arrays with different wavelengths, for example by defining different slot configurations on adjacent ridges and in which the complexities associated with subsequent alignment processes are reduced.

The present invention provides for a number of applications not previously economical using electronic or optoelectronic devices, including: optical communications, optical gas sensing, optical metrology and distance measurement.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention claimed is:

1. A method of manufacturing a semiconductor device from a semiconductor body comprising:
    forming a first layer of masking material on a surface of the semiconductor body, wherein the first layer of masking material provides at least one topographical outline, an outline of a cleave marking region and an outline of at least one alignment or registration feature distinct from the at least one topographical outline;
    performing one or more processes to form at least one topographical feature from the at least one topographical outline, a cleave marking notch from the cleave marking region and at least one alignment or registration feature from the at least one outline of the at least one alignment or registration feature;
    forming an outline of a second cleave marking region in a second layer of masking material on the surface of the semiconductor body, where the second cleave marking region overlaps the notch formed in the cleave marking region; and
    performing an etching using a crystallographic etch to form a cleave marking feature, such that the at least one topographical feature, the cleave marking feature and the at least one alignment or registration feature are aligned with respect to one another,
    wherein the forming of the outlines of said cleave marking region and said second cleave marking region, and the forming of the outline of said at least one alignment or registration feature, are formed in a single lithographic step.

2. A method of manufacturing a semiconductor device according to claim 1, wherein said semiconductor device is an optoelectronic device.

3. A method of manufacturing a semiconductor device according to claim 2, wherein a first topographical feature defines a waveguide.

4. A method of manufacturing a semiconductor device according to claim 3, wherein said waveguide has an associated defect formed therein.

5. A method of manufacturing a semiconductor device according to claim 4, wherein the cleave marking feature is aligned with respect to the associated defect.

6. A method of manufacturing a semiconductor device according to claim 4, wherein said semiconductor device is a laser.

7. A method of manufacturing a semiconductor device according to claim 6, wherein said semiconductor device is a ridge laser.

8. A method of manufacturing a semiconductor device according to claim 7, wherein said defect is a slot formed in the ridge of the ridge laser.

9. A method of manufacturing a semiconductor device according to claim 1, wherein the step of performing one or more processes to form the at least one topographical feature, the cleave marking notch, and the at least one alignment or registration feature comprises a single etching process.

10. A method according to claim 1, wherein a second etching process is performed between the step of forming the outline in the second layer of masking material and the step of using a crystallographic etch.

11. A method according to claim 1, comprising the selective application of a joining material onto the surface of at least one of the alignment/registration features.

12. A method according to claim 11, comprising the step of placing the semiconductor device onto a second device or surface having at least one matching alignment or registration feature to the alignment or registration features of the semiconductor device.

13. A method according to claim 12, wherein the pattern of the at least one alignment or registration feature of the semiconductor device is a mirror image of the at least one alignment/registration feature of the second device/surface.

14. A method according to claim 11 or claim 12, wherein said joining material comprises a solder or adhesive material.

15. A method according to claim 1, wherein said masking material is a photo resist material.

16. A method according to claim 12, further comprising the use of reflow process so as to cause the mutual alignment of the alignment or registration features of the semiconductor device with corresponding features in the second device/surface.

17. A method of manufacturing a semiconductor device from a semiconductor body comprising:
   forming a first layer of masking material on a surface of the semiconductor body, wherein the first layer of masking material provides at least one topographical outline, and an outline of a cleave marking region;
   performing one or more processes to form at least one topographical feature from the at least one topographical outline, a cleave marking notch from the cleave marking region;
   forming an outline of a second cleave marking region in a second layer of masking material on the surface of the semiconductor body, where the second cleave marking region overlaps the notch formed in the cleave marking region;
   performing an etching using a crystallographic etch to form a cleave marking feature;
   singulating, cleaving or separating the semiconductor device using the cleave marking feature; and placing the semiconductor device on a second device or surface having a pattern of alignment or registration features formed thereon, and whereon the pattern formed by the material correspond to the outline of the at least one topographical feature of the semiconductor device and where a layer of joining material is selectively pre-placed on the alignment or registration features of either the semiconductor device or the second device or surface, such that forces in the joining material cause at least one topographical features of the semiconductor device and the second device or surface to mutually align,
   wherein the forming of the outlines of said cleave marking region and said second cleave marking region and the outline of said at least one alignment or registration feature are formed in a single lithographic step.

18. A method of manufacturing a semiconductor device according to claim 17, wherein said semiconductor device is an optoelectronic device.

19. A method of manufacturing a semiconductor device according to claim 17, wherein a first topographical feature defines a waveguide.

20. A method of manufacturing a semiconductor device according to claim 19, wherein said waveguide has an associated defect formed therein.

21. A method of manufacturing a semiconductor device according to claim 20, wherein the cleave marking feature is aligned with respect to the associated defect.

22. A method of manufacturing a semiconductor device according to claim 19, wherein said semiconductor device is a laser.

23. A method of manufacturing a semiconductor device according to claim 21, wherein said semiconductor device is a ridge laser.

24. A method of manufacturing a semiconductor device according to claim 23, wherein said associated defect is a slot formed in the ridge of the ridge laser.

25. A method of manufacturing a semiconductor device according to claim 17, wherein the step of performing one or more processes to form the at least one topographical feature and the cleave marking notch, comprises a single etching process.

26. A method according to claim 17, wherein a second etching process is performed between the step of forming the outline in the second layer of masking material and the step of using a crystallographic etch.

27. A method according to claim 17, comprising the selective application of a joining material onto the surface of at least one of the topographical features.

28. A method according to claim 17, wherein the pattern of the at least one topographical feature of the semiconductor device is a mirror image of the at least one alignment/registration feature of the second device/surface.

29. A method according to claim 17, wherein said joining material comprises a solder or adhesive material.

30. A method according to claim 17, wherein said masking material is a photo resist material.

31. A method according to claim 17, further comprising the use of reflow process so as to cause the mutual alignment of the at least one topographical features of the semiconductor device with corresponding features in the second device/surface.

* * * * *